United States Patent
Kim

(10) Patent No.: US 9,831,286 B2
(45) Date of Patent: Nov. 28, 2017

(54) ELECTRONIC DEVICE AND METHOD FOR FABRICATING THE SAME

(71) Applicant: SK hynix Inc., Icheon-Si (KR)

(72) Inventor: Yu-Jin Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 498 days.

(21) Appl. No.: 14/509,515

(22) Filed: Oct. 8, 2014

(65) Prior Publication Data
US 2015/0295010 A1 Oct. 15, 2015

(30) Foreign Application Priority Data

Apr. 10, 2014 (KR) ........................ 10-2014-0042957

(51) Int. Cl.
| | |
|---|---|
| *G06F 12/08* | (2016.01) |
| *G06F 13/28* | (2006.01) |
| *H01L 27/22* | (2006.01) |
| *H01L 45/00* | (2006.01) |
| *H01L 29/423* | (2006.01) |
| *H01L 45/02* | (2006.01) |
| *H01L 29/06* | (2006.01) |
| *G06F 12/0868* | (2016.01) |
| *H01L 29/66* | (2006.01) |
| *H01L 43/08* | (2006.01) |
| *H01L 43/10* | (2006.01) |

(52) U.S. Cl.
CPC ........ *H01L 27/228* (2013.01); *G06F 12/0868* (2013.01); *G06F 13/28* (2013.01); *H01L 29/0653* (2013.01); *H01L 29/4236* (2013.01); *H01L 29/66621* (2013.01); *H01L 43/08* (2013.01); *H01L 43/10* (2013.01); *G06F 2212/604* (2013.01); *H01L 45/04* (2013.01)

(58) Field of Classification Search
None
See application file for complete search history.

(56) References Cited

U.S. PATENT DOCUMENTS

| | | | |
|---|---|---|---|
| 2008/0230832 A1* | 9/2008 | Cho | ............... H01L 29/66795 257/327 |
| 2009/0026547 A1* | 1/2009 | Lee | ............... H01L 21/823437 257/368 |

(Continued)

FOREIGN PATENT DOCUMENTS

KR 10-0743655 B1 7/2007

*Primary Examiner* — Ernest Unelus
*Assistant Examiner* — Dayton Lewis-Taylor
(74) *Attorney, Agent, or Firm* — Perkins Coie LLP

(57) ABSTRACT

This technology provides an electronic device and a method of fabricating the same. An electronic device in accordance with an implementation of this document includes a transistor comprising a semiconductor substrate including an active region defined by an isolation layer; and a gate which is formed over the active region and the isolation layer and extends in a first direction to cross the active region, wherein the active region includes a head portion towering over the isolation layer, a body portion disposed under the head portion, and a neck portion which is disposed between the head portion and the body portion and is recessed compared to the head portion and the body portion in the first direction, in a region where the gate and the active region overlap with each other.

18 Claims, 12 Drawing Sheets

(56) References Cited

U.S. PATENT DOCUMENTS

| | | | |
|---|---|---|---|
| 2009/0040802 A1* | 2/2009 | Arakawa | B82Y 10/00 365/51 |
| 2010/0237397 A1* | 9/2010 | Uchiyama | H01L 27/10876 257/306 |
| 2012/0063196 A1* | 3/2012 | Kim | G11C 13/0004 365/148 |
| 2012/0187360 A1* | 7/2012 | Eungyoon | G11C 11/161 257/2 |

* cited by examiner

ELECTRONIC DEVICE AND METHOD FOR FABRICATING THE SAME

CROSS-REFERENCE TO RELATED APPLICATIONS

This patent document claims priority of Korean Patent Application No. 10-2014-0042957, entitled "ELECTRONIC DEVICE AND METHOD FOR FABRICATING THE SAME" and filed on Apr. 10, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device may include a transistor having an excellent characteristic and a semiconductor memory having the transistor and a method of fabricating the same.

In one aspect, an electronic device is provided to include a transistor which includes a semiconductor substrate including an active region defined by an isolation layer; and a gate which is formed over the active region and the isolation layer and extends in a first direction to cross the active region, wherein the active region includes a head portion protruding over the isolation layer, a body portion disposed under the head portion, and a neck portion which is disposed between the head portion and the body portion and is recessed compared to the head portion and the body portion in the first direction, in a region where the gate and the active region overlap with each other.

In some implementations, the gate surrounds the head portion and the neck portion in the first direction. In some implementations, the transistor further comprises: an insulating layer formed in the neck portion, and wherein the head portion and the body portion are electrically separated from each other by the insulating layer. In some implementations, the neck portion is electrically insulating so that the head portion and the body portion are electrically separated from each other. In some implementations, the semiconductor substrate is a bulk substrate. In some implementations, the transistor further comprises: junction regions formed in the active region disposed at both sides of the gate, and wherein the head portion is surrounded by the insulating layer and the junction regions. In some implementations, the electronic device comprises an insulating layer formed over surfaces of the head portion and neck portion. In some implementations, the semiconductor substrate includes a bulk part including only a semiconductor material and an element part which is disposed over the bulk part and includes other elements than the semiconductor material, and the gate is formed inside the element part in the region where the gate and the active region overlap with each other. In some implementations, the semiconductor substrate includes a bulk part including only a semiconductor material and an element part which is disposed over the bulk part and includes other elements than the semiconductor material, and the gate is formed over the element part in the region where the gate and the active region overlap with each other. In some implementations, the electronic device further comprises: a memory element coupled to the active region disposed at a side of the gate. In some implementations, the memory element includes a variable resistance element which is switched between different resistance states according to an applied voltage or current. In some implementations, the variable resistance element includes a first magnetic layer, a second magnetic layer and a tunnel barrier layer interposed between the first magnetic layer and the second magnetic layer In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the transistor is part of at least one of the control unit, the operation unit and the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the transistor is part of at least one of the core unit, the cache memory unit and the bus interface in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the transistor is part of at least one of the processor, the auxiliary memory device, the main memory device and the interface device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the transistor is part of at least one of the controller, the storage device, the temporary storage device and the interface in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the transistor is part of at least one of the memory controller, the memory, the buffer memory and the interface in the memory system.

In another aspect, a method of manufacturing an electronic device comprising a transistor is provided. The method comprises: providing a semiconductor substrate including an active region defined by an isolation layer; forming a towering or protruding part of the active region which towers over the isolation layer in a region where a gate extending in a first direction to cross the active region is to be formed; forming a neck portion by recessing a lower part of the towering or protruding part of the active region in the first direction; and forming the gate over the active region and the isolation layer in the region where the gate is to be formed.

In some implementations, the forming of the neck portion comprises: forming a first sacrifice layer and a second sacrifice layer over the towering or protruding part of the active region and the isolation layer; performing an etching process to the first and second sacrifice layers until a top surface of the isolation layer is exposed in the region where the gate is to be formed; removing a lower end of the first sacrifice layer which is exposed by the etching; and removing a part of the active region which is exposed by the removing of the lower end of the first sacrifice layer. In some implementations, the method further comprises: forming an insulating layer in the neck portion which electrically separates a part of the active region disposed over the neck portion and a part of the active region disposed under the neck portion from each other, after the forming of the neck portion. In some implementations, the forming of the insulating layer is performed by a thermal oxidation process. In some implementations, the forming of the towering or protruding part of the active region is performed by etching the active region and the isolation layer to a first depth and to a second depth which is larger than the first depth, respectively, in the region where the gate is to be formed. In some implementations, the forming of the towering or protruding part of the active region is performed by etching the isolation layer to a certain depth, in the region where the gate is to be formed.

In another aspect, a method of manufacturing an electronic device comprising a transistor is provided. The method comprises processing a semiconductor substrate to form active regions that are separated by one or more isolation trenches each including an isolation layer; forming a protruding part in an active region which protrudes above an isolation layer in a region where a gate for the transistor that extends in a first direction to cross the active region is to be formed; forming a neck portion by recessing a lower part of the protruding part in the active region in the first direction; and forming the gate over the active region and the isolation layer.

In some implementations, the forming of the neck portion includes: forming a first sacrifice layer and a second sacrifice layer over the protruding part of the active region and the isolation layer; performing an etching process to the first and second sacrifice layers until a top surface of the isolation layer is exposed in the region where the gate is to be formed; removing a lower end of the first sacrifice layer which is exposed by the etching process to expose a lower part of the protruding part of the active region; and removing the lower part of the active region to form the neck portion. In some implementations, the method further comprises: preforming a treatment to the neck portion to turn the neck portion to be electrically insulating to electrically separate a part of the active region disposed over the neck portion and a part of the active region disposed under the neck portion from each other. In some implementations, the treatment includes a thermal oxidation process. In some implementations, the forming of the protruding part of the active region includes etching the active region and the isolation layer to a first depth and to a second depth greater than the first depth, respectively, in the region where the gate is to be formed.

In another aspect, an electronic device includes a transistor formed in a semiconductor structure which includes a substrate; active regions formed in the substrate, each active region including drain and source regions for the transistors; isolation trenches formed in the substrate and located between the active regions to separate the active regions, the isolation trenches being separated from one another along a first direction and each extending along a second direction; isolation layers respectively formed in the isolation trenches to separate the active regions; wherein each active region includes a protruding portion that protrudes over the isolation layer, a body portion that is located at a level at and below the isolation layer and a neck portion between the protruding portion and the body portion that is recessed relative to the protruding and body portions to have a smaller width; and gates formed of an electrically conductive material, located over the active regions and separated from one another in the second direction, each gate being structured to extend in the first direction, to surround a protruding portion of an active region, and to locate between a source region and a drain region to form a transistor.

In some implementations, the device comprises an insulating layer formed over surfaces of the protruding portion and neck portion of each active region. In some implementations, each neck portion is electrically insulating to electrically separate the protruding portion and the body portion. In some implementations, the neck portion is structured to provide a large recess to increase a contact area between a gate and a corresponding active region. In some implementations, the device further includes an array of memory elements on the substrate each operable to store data, wherein each memory element is electrically coupled to a respective transistor to be connected to a corresponding bit line through a corresponding contact. In some implementations, each memory element includes a variable resistance element on the substrate which exhibits different resistance values to store data. In some implementations, each variable resistance element includes a magnetic tunnel junction.

These and other aspects, implementations and associated advantages are described in greater detail in the drawings, the description and the claims.

DETAILED DESCRIPTION

Figure 1A:
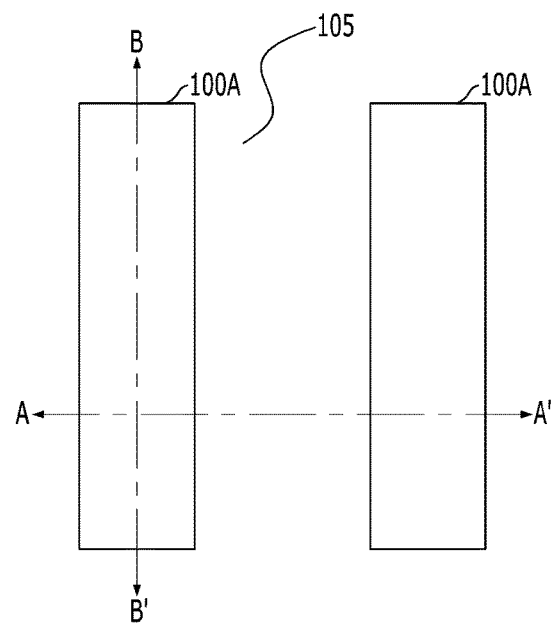
FIGS. 1A through 7 are views explaining a transistor and an example of a method for fabricating the same in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multilayer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory in accordance with an implementation of the present disclosure may include a cell array in which a plurality of memory cells are arrayed. Each memory cell may include a memory element for storing data and an access element for controlling an access to the memory element. In implementations of devices based on such a semiconductor memory, the access element may include a transistor configured to exhibit an improved characteristic. Hereinafter, various examples of implementations will be described in more detail with reference to the figures.

FIGS. 1A to 7 are views explaining a transistor and an example of a method for fabricating the same in accordance with an implementation. Plan views, cross-sectional views or both plan view and crossection views of disclosed implementations are shown and used in the following description, as needed. A cross-sectional view is a view taken along lines A-A' or B-B' of a corresponding plan view.

A fabrication method and various structures associated with the fabrication and the final circuit or device will be described and are followed by an example of the circuit structure and electronic devices using the disclosed circuit structure.

Figure 1B:
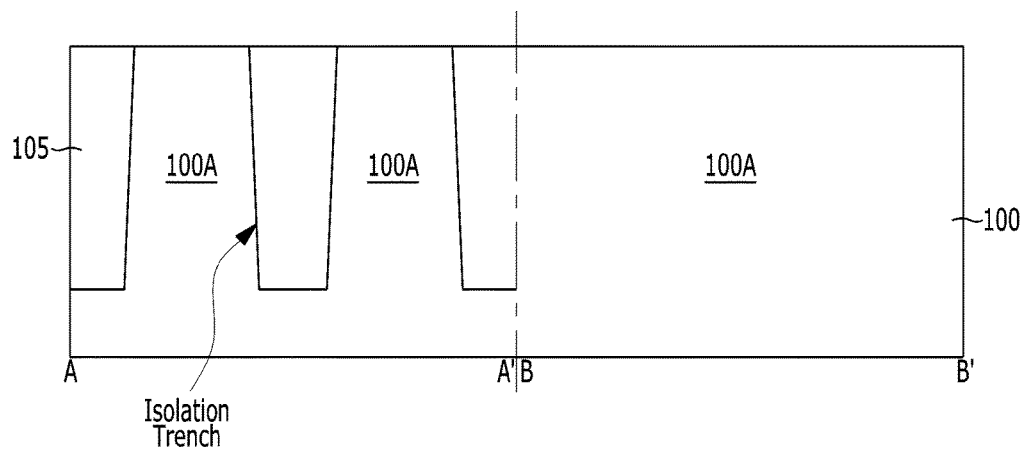

Referring to FIGS. 1A and 1B, a semiconductor substrate 100 may be provided and may include various semiconductor materials, such as a silicon. The semiconductor substrate 100 may include a bulk substrate that can be obtained at a low price.

One or more active regions 100A may be defined and formed in the semiconductor substrate 100 by forming an isolation layer 105. Each isolation layer 105 may be formed by selectively etching an isolation region into the semiconductor substrate 100 to form one or more isolation trenches which define the one or more active regions 100A, and filling each isolation trench with an insulating material which may be implemented by various insulating materials such as an oxide, a nitride or some other materials. In the illustrated implementation, a plurality of active regions 100A may be arranged at different locations on the substrate 100 and spaced apart from each other in a first direction which is parallel to a line A-A', and each active region 100A may extend in a second direction which is parallel to a line B-B'. A shape, a number and an arrangement of the one or more active regions 100A may change in various ways in other implementations.

Figure 2A:
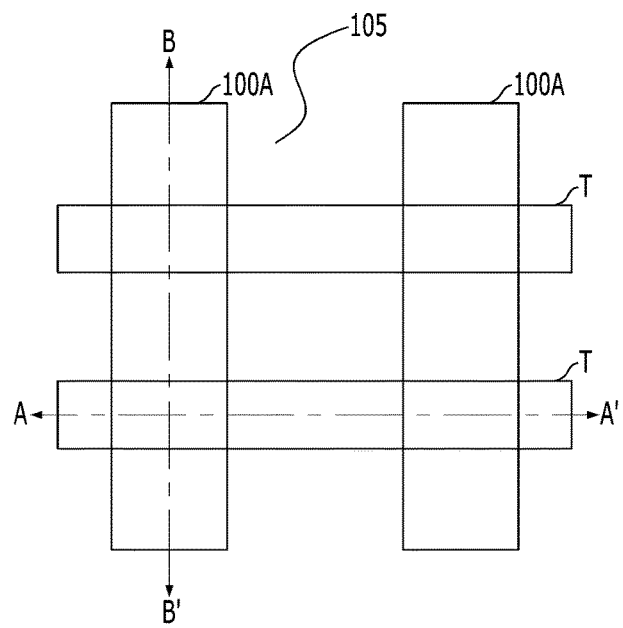
Figure 2B:
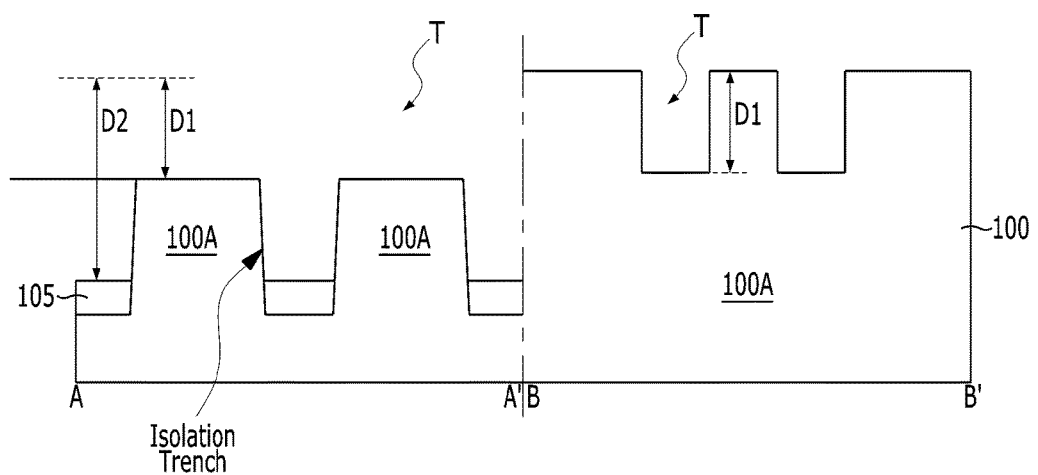

Referring to FIGS. 2A and 2B, a gate trench T may be formed to extend across or through one or more active region 100As and one or more isolation layers 105 in the first direction A-A' by selectively etching the one or more active regions 100A and the one or more isolation layers 105. In the illustrated implementation, a plurality of gate trenches T may be arranged to be spaced apart from each other in the second direction B-B', and each gate trench T may cross the active regions 100A which are arranged in the first direction A-A'. A shape, a number and an arrangement of the gate trenches T may change in various ways in other implementations.

In order to form a gate trench T, the one or more active regions 100A and the one or more isolation trenches for forming corresponding one or more isolation layers 105 are etched. The isolation layer 105 in each isolation trench may be etched to have a greater depth than the depth of the active region 100A. A depth D2 of the gate trench T overlapping with the isolation layer 105 may be greater than a depth D1 of the gate trench T overlapping with the active region 100A so that the top of the active region 100A may be above the top of the isolation layer 105. Therefore, the active region 100A may have a portion that protrudes above or towers over the isolation layer 105 in a region where the gate trench T is formed. For a convenience of description, a part of the active region 100A which overlaps with the gate trench T and towers over, or protrudes above, the isolation layer 105 may be referred to as a towering or protruding part of the active region 100A.

Figure 3:
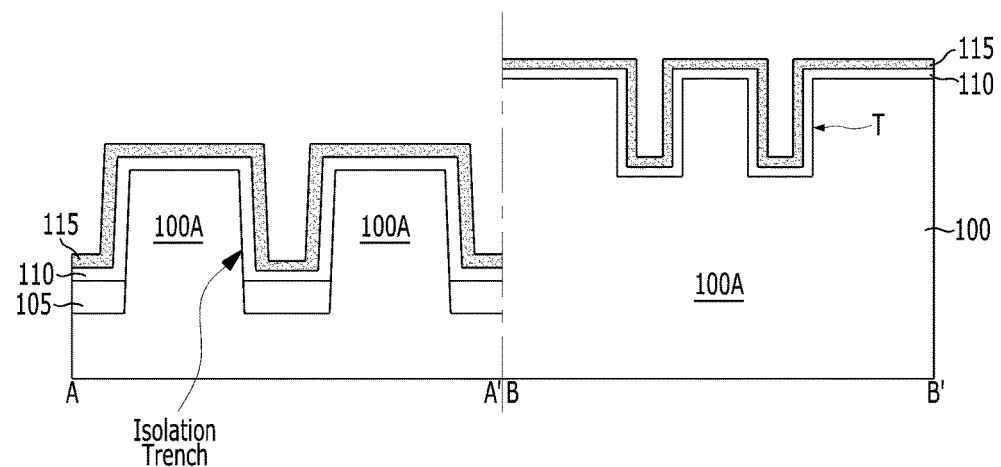

Referring to FIG. 3, sacrifice layers 110 and 115 may be formed over a resultant structure of FIGS. 2A and 2B and may be used for forming a neck portion, which will be described later. In this implementation, the sacrifice layer 110 and 115 may include a first sacrifice layer 110 formed over exposed surfaces of the isolation layers 105 in isolation trenches, and exposed surfaces of the active regions 110A and a second sacrifice layer 115 over the first sacrifice layer 110. The two sacrifice layers 110 and 115 can have different etching rates, e.g., the first sacrifice layer 110 may have a higher etching rate than the second sacrifice layer 115. For example, in one implementation, the first sacrifice layer 110 may include an oxide such as a silicon oxide, and the second sacrifice layer 115 may include a nitride such as a silicon nitride.

Although not explicitly shown in FIG. 3, in a region where a gate trench T is formed, a thickness of the first and second sacrifice layers 110 and 115 disposed over a top surface of an active region 100A may be controlled to be larger than a thickness of the first and second sacrifice layers 110 and 115 disposed over a top surface of an isolation layer 105. This is because, when the first and second sacrifice layers 110 and 115 are deposited, a distance to the top surface of the active region 100A is smaller than a distance to the top surface of the isolation layer 105. A deposition thickness of the first and second sacrifice layers 110 and 115 may be modified or controlled in various manners to achieve a desired thickness value.

Figure 4:
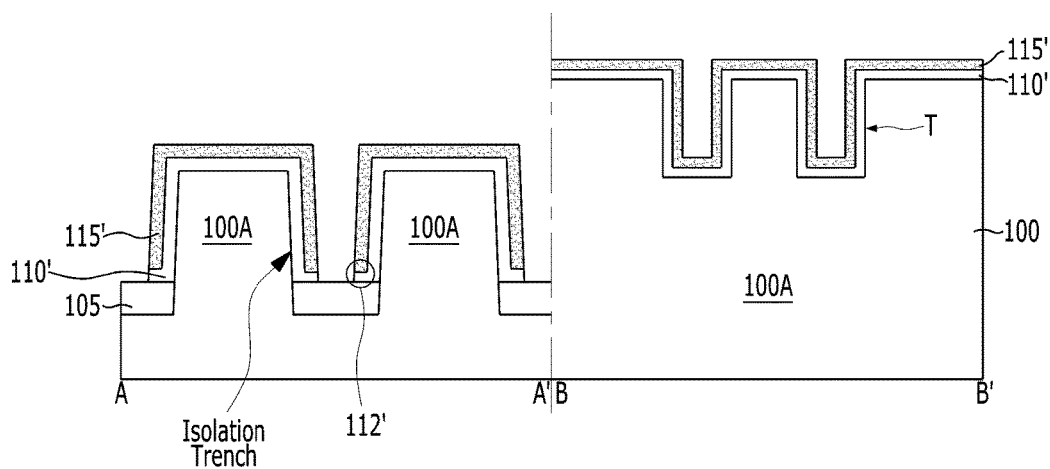

Referring to FIG. 4, first and second sacrifice patterns 110' and 115' may be formed by performing a blanket etching to the first and second sacrifice layers 110 and 115 in the vertical direction. The blanket etching is performed until the top surface of the isolation layer 105 is exposed in the region where the gate trench T is formed. In the region where the gate trench T is formed, when the top surface of the isolation layer 105 is exposed, the top surface of the active region 100A may not be exposed. This is because, as explained above, in the region where the gate trench T is formed, the thickness of the first and second sacrifice layers 110 and 115 which are disposed over the top surface of the active region 100A is greater than the thickness of the first and second sacrifice layers 110 and 115 which are disposed over the top surface of the isolation layer 105.

As a result of the above etching, the first sacrifice pattern 110' may surround top and side surfaces of the towering or protruding part of the active region 100A. Further, a lower end of the first sacrifice pattern 110' in an isolation trench above the top surface of the corresponding isolation layer 105 and on a side of an active region 110A may have an extended sacrifice portion 112' that is between the underlying isolation layer 105 and overlying second sacrifice layer 115' and appears to bend toward an outside of or away from, the active region 100A. The second sacrifice pattern 115' may cover the first sacrifice pattern 110' everywhere except for the side part of the extended sacrifice portion 112' of the first sacrifice pattern 110'. The lower end of the second sacrifice pattern 115' is positioned above the lower end of the first sacrifice pattern 110' which includes the extended sacrifice portion 112'. That is, the second sacrifice pattern 115' may surround top and side surfaces of the first sacrifice pattern 110' except for the lower end of the first sacrifice pattern 110' having the extended sacrifice portion 112'. Therefore, the lower end of the first sacrifice pattern 110' may be exposed at the end of the extended sacrifice portion 112'.

Figure 5:
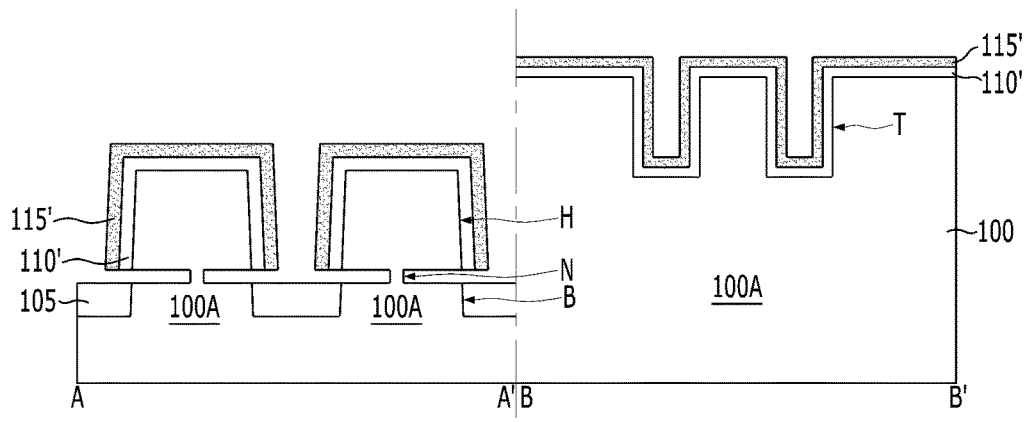

Referring to FIG. 5, the exposed lower end of the first sacrifice pattern 110' may be removed using a suitable technique such as an etching process, etc. Therefore, a side of a lower part of the towering or protruding part of the active region 100A may be exposed.

Next, a removal process such as an etching process is performed to partially remove the lower part of the towering or protruding part of the active region 100A to form a ring while leaving a central portion of the active region 100A as a narrow support structure to hold the remaining part of the towering or protruding part of the active region 100A. This removal process is performed by first selectively removing the lower end of the first sacrifice pattern 110' by preferentially removing the extended sacrifice portion 112' without removing the second sacrifice pattern 115' or removing the second sacrifice pattern 115' at a rate significantly slower than the rate for removing the first sacrifice pattern 110'. This selective removal process exposes a portion of the active region 110A initially covered by the lower part of the first sacrifice pattern 110' and then continues to remove the exposed portion of the active region 110A to form a narrow middle portion of the active region 110A as illustrated in FIG. 5. Thus, different from an upper part of the towering or protruding part of the active region 100A, the lower part of the towering or protruding part of the active region 100A is recessed inwardly towards the center of the active region 100A, towering or protruding part As a result, the active region 100A may include three portions including an upper portion, a lower portion, and a middle portion. The middle portion is a narrow "neck" portion and is concave with relative to the upper and lower portions while the upper and the lower portions are larger in their lateral dimension than the middle are convex relative to the narrow middle portion. So, the active region 100A may have a tube-like shape. For a convenience of description, the upper portion corresponding to the upper part of the towering or protruding part of the active region 100A which is not etched and having a convex shape may be referred to as a head portion H, the middle portion corresponding to the lower part of the towering or protruding part of the active region 100A which has been etched and having a concave shape may be referred to as a neck portion N, and the lower portion which is disposed under the towering or protruding part of the active region 100A may be referred to as a body portion B.

Figure 6:
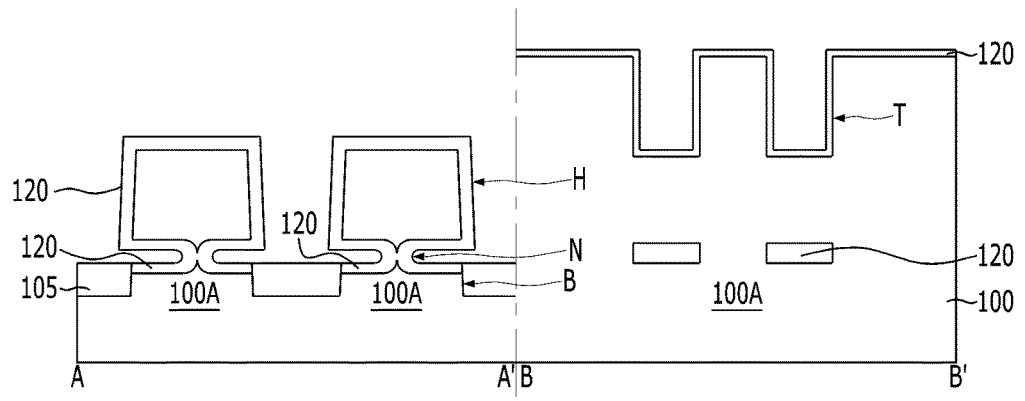

Referring to FIG. 6, after completing the processing in FIG. 5, the first and second sacrifice patterns 110' and 115' may be removed.

Subsequently, a thermal treatment may be performed to produce a layer of an insulating material 120 on a surface of the active region 100A which is exposed by the removal of the first and second sacrifice patterns 110' and 115.' Such thermal treatment may be performed in an atmosphere including an element which reacts with a semiconductor material of the semiconductor substrate 100 to produce the layer of the insulating material 120 on the surface of the active region 100A. Upon completing the thermal treatment, the surface layer of the active region 100A is changed into the insulating layer 120. For example, a thermal oxidation may be performed to the surface of the active region 100A which is exposed by the proceeding removal of the first and second sacrifice patterns 110' and 115.' Such thermal oxidation may form the insulating layer 120 including an oxide such as a silicon oxide, etc.

During the formation of the insulating layer 120, it is possible the entirety of the neck portion N of the active region 100A, which has a relatively small width, may be changed into the insulating layer 120. In this case, the head portion H and the body portion B may be electrically separated from each other by the insulating layer 120 which is formed in the neck portion N. Therefore, the head portion H may be in a floating state in which the head portion H is not electrically connected with other portions. This is because the head portion H is surrounded by the insulating layer 120 in the first direction. In the meantime, the head portion H is surrounded by junction regions, which will be described layer, in the second direction.

Figure 7:
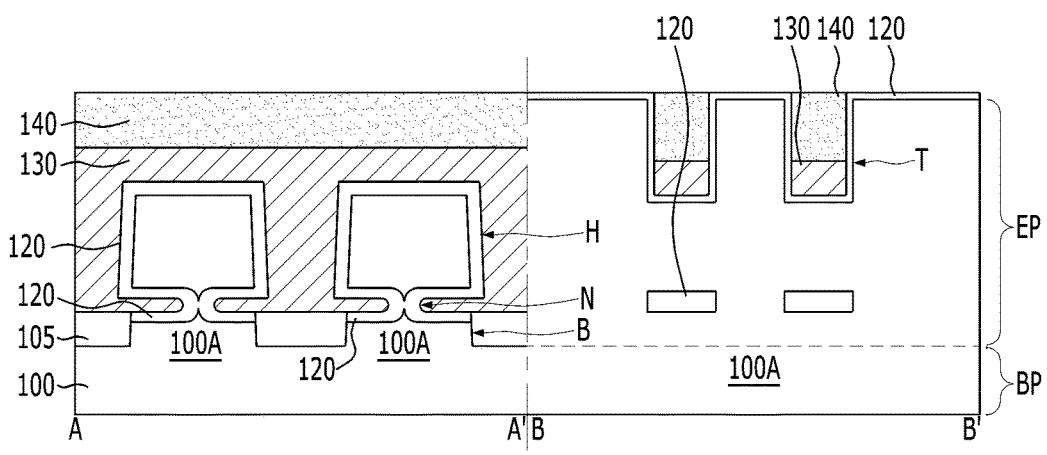

Referring to FIG. 7, based on the structure in FIG. 6, a gate 130 may be formed to fill in a part of the gate trench T in which the insulating layer 120 is formed. The gate 130 may be formed by forming an electrically conductive material such as a metal, or a metal nitride, etc, over a resultant structure including the insulating layer 120, and performing an etch-back process until the conductive material has a desired height. While in the illustrated implementation in FIG. 7 that the gate 130 is filled in the part of the gate trench T, different configurations for constructing the gate 130 are also possible in other implementations. For example, the gate 130 may be fill up the entire gate trench T. Alternately, for example, the gate 130 may fill the entirety of the gate trench T and tower over the semiconductor substrate 100.

The gate 130 may surround the head portion H and the neck portion N of the active region 110A in the region where the gate trench T is formed. The insulating layer 120 may be interposed between the gate 130 and the active region 100A to serve as a gate dielectric layer.

Next, a gate protection layer 140 may be formed over the gate 130. When the gate 130 is filled in the part of the gate trench T as shown in FIG. 7, the gate protection layer 140 may be disposed over the gate 130 to fill a remaining part of the gate trench T. The gate protection layer 140 may be formed by forming an insulating material such as an oxide, a nitride, or other suitable materials, over a resultant structure including the gate 130, and performing a planarization process, for example, CMP (Chemical Mechanical Polishing), until the semiconductor substrate 100 or the insulating layer 120 is exposed.

Then, although not shown explicitly in FIG. 7, junction regions may be formed in the active region 100A disposed at two sides of the gate 130 by doping impurities as the drain and source regions for forming transistors.

The aforementioned processes can be used to fabricate one or more transistors as shown by the example of a transistor in FIG. 7.

Referring back to FIG. 7, the transistor may include the gate trench T and the gate 130. The gate trench T may be formed in the semiconductor substrate including the active region 100A and the isolation layer 120, and extends in the first direction to cross the active region 100A. The gate 130 may be buried in a part of the gate trench T. Here, at least a part of the gate 130 may be filled in the gate trench T. Also, the junction regions, for example, a source region and a drain region, may be provided by doping impurities in the active region 100A at the both sides of the gate 130 so that the source region, the drain region and the gate 130 can form a three-terminal transistor. The insulating layer 120 may be interposed between the gate 130 and the active region 100A and serve as a gate dielectric layer.

Under the gate 130, the active region 100A may be above or tower over the isolation layer 105. The lower part of the towering or protruding part of the active region 100A may be recessed inwardly of the active region unlike the upper part of the towering or protruding part of the active region 100A. Due to the recess, the lower part of the towering or protruding part of the active region 100A has a smaller width than that of the upper part of the towering or protruding part of the active region 100A. As described above, the upper part of the towering or protruding part of the active region 100A may be referred to as the head portion H, the lower part of the towering or protruding part of the active region 100A may be referred to as the neck portion N, and a part of the active region 100A disposed under the neck portion N may be referred to as the body portion B. The neck portion N may be formed by being recessed inwardly, in the first direction unlike the head portion H and the body portion B. In this case, since the gate 130 contacts not also the top surface of the active region 100A but also the side surface of the towering or protruding part of the active region 100A, a contact area between the gate 130 and the active region 100A may be increased. Furthermore, since the lower part of the towering or protruding part of the active region 100A is recessed inwardly, a contact area between the gate 130 and the active region 100A may be further increased. The increase in the contact area between the gate 130 and the active region 100A means an increase in a channel area of the transistor. As a result, an operating current of the transistor may be increased.

Also, the head portion H and the body portion B may be electrically separated from each other depending on a thickness of the insulating layer 120 formed in the neck portion N. A configuration in which the head portion H and the body portion B are insulated from each other may be realized by using a bulk-type semiconductor substrate. Thus, the use of a bulk-type semiconductor substrate results in the similar effect of using an expensive SOI (Silicon On Insulator) substrate. For example, since the head portion H is separated from the body portion B, a fully depleted channel may be implemented in the head portion H. Further, the variation of a threshold voltage of the transistor which is caused by the diffusion of various impurities of the body portion B, for example, impurities of a well region, into the head portion B may be prevented.

In the present implementation, since the active region 100A (over which the gate is formed) is above or towers over the isolation layer 105 and has a tube-like shape, a contact area between the gate 130 and the active region 100A may be maximized, thereby improving a characteristic of the formed transistor. Furthermore, by separating the head portion H and the body portion B from each other using the insulating layer 120 formed in the neck portion N of the tube-like active region 100A, a characteristic of the transistor may be further improved.

The above transistor may be used as an access element for accessing to a memory element in various memories. For example, the above transistor may be coupled to a memory element which requires a high operating current, for example, a variable resistance element such as a magneto-resistive element which requires a high current when being switched between a high resistance state and a low resistance state. Hereinafter, this implementation will be exemplarily described.

Figure 8A:
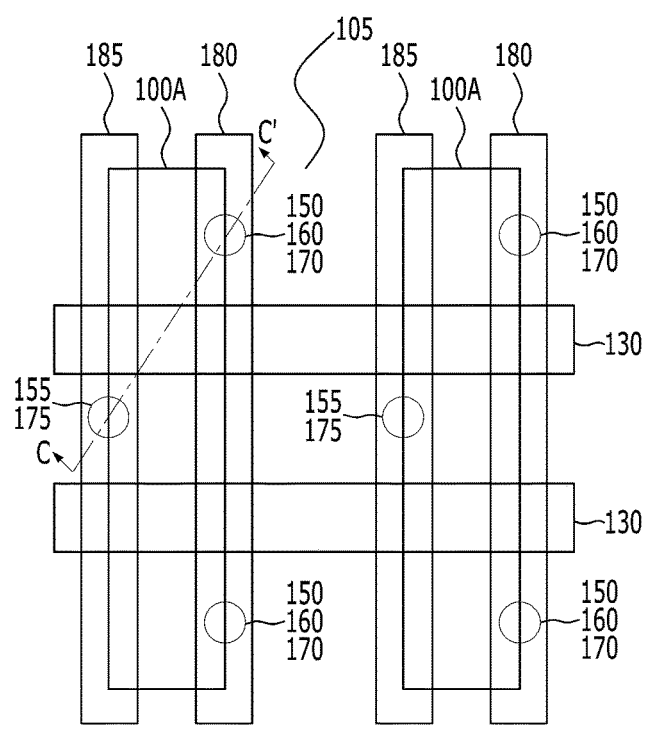
FIGS. 8A and 8B are views explaining a semiconductor memory in accordance with an implementation of the present disclosure.
Figure 8B:
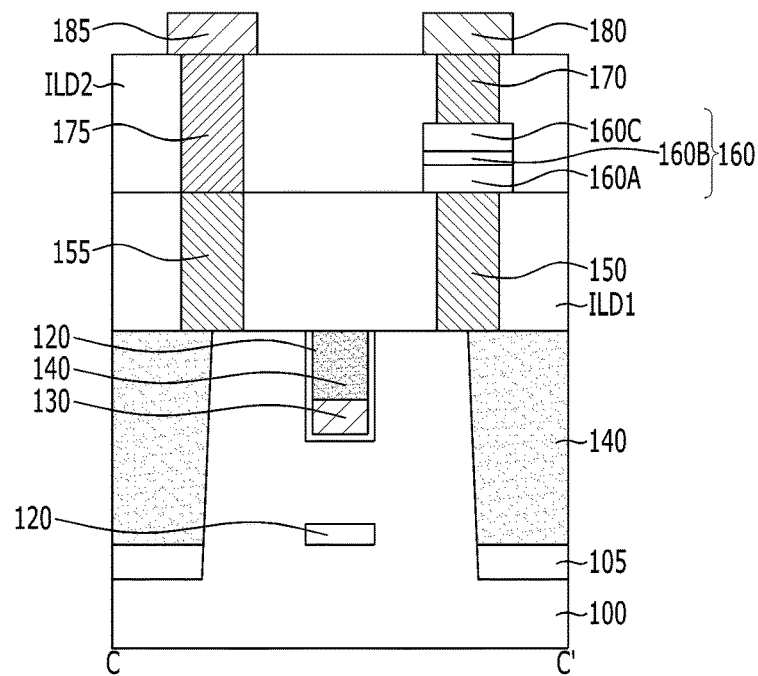

FIGS. 8A and 8B are views explaining a semiconductor memory in accordance with an implementation of the present disclosure.

Referring to FIGS. 8A and 8B, the semiconductor memory may include a variable resistance element 160, a bit line 180, and a source line 185. The variable resistance element 160 may be coupled to the transistor of FIG. 7 at the bottom of the variable resistance element and coupled to a bit line 180 at the top of the variable resistance element 160. The source line 185 may be coupled to the other end of the transistor of FIG. 7. For example, the variable resistance element 160 may be coupled to the drain region of the transistor which is disposed at both sides of two gates 130 adjacent to each other in the second direction, and the source line 185 is coupled to the source region of the transistor which is disposed between the two gates 130.

For example, a first interlayer dielectric layer ILD1 may be formed over a resultant structure of FIG. 7. Then, first and second contacts 150 and 155 which are coupled to the drain region and the source region through the first interlayer dielectric layer ILD1, respectively, may be formed in the first interlayer dielectric layer ILD1. Here, the first contact 150 may be disposed over one side of the active region 100A in the first direction, for example, a right side, and the second contact 155 may be disposed over the other side of the active region 100A in the first direction, for example, a left side. In this case, a sufficient distance can be secured between a first stacked structure of the first contact 150, the variable resistance element 160, the third contact 170 and the bit line 180 and a second stacked structure of the second contact 155, the fourth contact 175 and the source line 185. Accordingly, an electrical bridge between the first stacked structure and the second stacked structure can be prevented.

The variable resistance element 160 may be formed over the first interlayer dielectric layer ILD1 to be coupled to the first contact 150.

The variable resistance element 160 may be switched between different resistance states according to an applied voltage or current through the transistor coupled to the bottom end of the variable resistance element 160 and the bit line 180 coupled to the top end of the variable resistance element 160. The variable resistance element 160 may include a single layer or a multiple layer including various materials which are used an RRAM, a PRAM, an FRAM, or an MRAM, etc, for example, a metal oxide such as a transition metal oxide or a perovskite-based material, a phase change material such as a chalcogenide-based material, a ferroelectric material, or a ferromagnetic material, etc. The variable resistance element 160 may store different data depending on its resistance states.

In this implementation, the variable resistance element 160 may include MTJ (Magnetic Tunnel Junction) structure including a first magnetic layer 160A, a tunnel barrier layer 160B and a second magnetic layer 160C. In this case, one of the first magnetic layer 160A and the second magnetic layer 160C may be a pinned layer having a pinned magnetization direction, and the other thereof may be a free layer having a variable magnetization direction. The first magnetic layer 160A and the second magnetic layer 160C may be formed of a single layer or a multiple layer including a ferromagnetic material, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or other suitable magnetic materials. The tunnel barrier layer 160B may change the magnetization direction of the free layer by the tunneling of electrons. The tunnel barrier layer 160B may include a single layer or a multiple layer including an oxide such as MgO, CaO, SrO, TiO, VO, NbO, or other suitable materials. When the magnetization directions of the free layer and the pinned layer are parallel to each other, the variable resistance element 160 may exhibit a low resistance state, and, when the magnetization directions of the free layer and the pinned layer are anti-parallel to each other, the variable resistance element 160 may exhibit a high resistance state. If a relatively high current is required to change the magnetization direction of the free layer, the transistor of this implementation may satisfy this requirement.

Other device layer configurations may be possible. Instead of the variable resistance element 160, various memory elements for storing data may be used to substitute the variable resistance element 160. For example, a capacitor may be coupled to one end of the transistor as a memory element.

A second interlayer dielectric layer ILD2 may be formed over the variable resistance element 160 and the first interlayer dielectric layer ILD1. The third contact 170 coupled to the variable resistance element 160 and the fourth contact 175 coupled to the second contact 155 may be formed in the second interlayer dielectric layer ILD2.

The bit line 180 extending in the second direction and coupled to the third contact 170, and the source line 185 extending in the second direction and coupled to the fourth contact 175 may be formed over the second interlayer dielectric layer ILD2.

The above semiconductor memory may be fabricated using the transistor which has an improved performance, for example, an increased operating current. Therefore, an operating characteristic of the semiconductor memory may be improved.

Meanwhile, referring to FIG. 7, in a vertical direction which is perpendicular to a top surface of the semiconductor substrate 100, the semiconductor substrate 100 may include a bulk part BP including only a semiconductor material of the substrate 100 and an element part EP which is located over the bulk part BP and is processed to include various structures or elements such as the isolation layer 105, the gate 130, etc. Here, at least a part of the gate 130 may be formed inside the element part EP in the region where the gate 130 and the active region 100A overlap with each other, as shown in the cross-section taken along the line B-B' of FIG. 7. This is because the gate 130 is formed in the gate trench T which is formed by etching the isolation layer 105 and the active region 100A. However, other device configurations are also possible. For example, if the forming of the gate trench T may be skipped, a gate may be formed over the element part EP in a region where the gate and the active region 100A overlap with each other. This will be described exemplarily with reference to FIGS. 9A to 11.

FIGS. 9A to 11 are views explaining a transistor and an example of a method for fabricating the same in accordance with another implementation of the disclosed technology in this patent document. Differences from the above implementations will be mainly described.

Figure 9A:
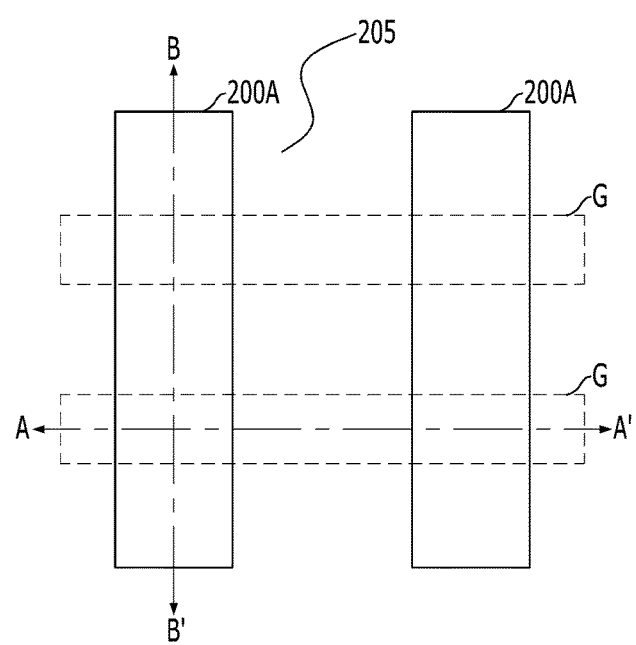
FIGS. 9A through 11 are views explaining a transistor and an example of a method for fabricating the same in accordance with another implementation of the present disclosure.
Figure 9B:
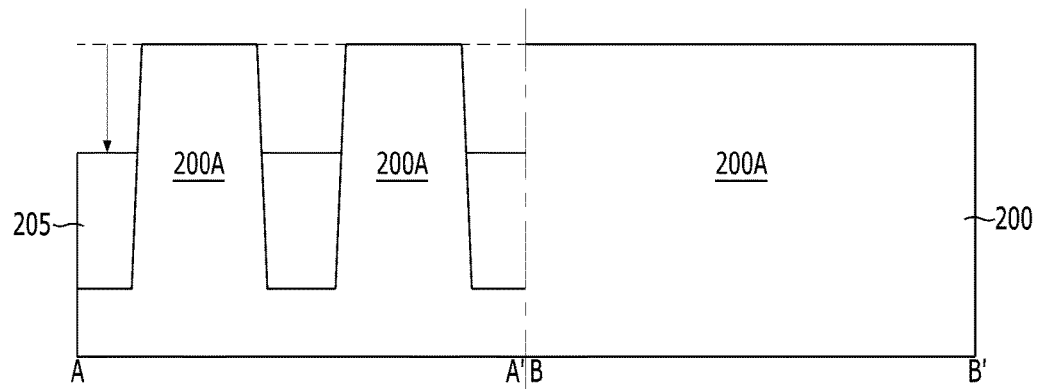

Referring to FIGS. 9A and 9B, an active region 200A of a semiconductor substrate 200 may be defined by forming one or more isolation layers 205. This is similar to the design in FIG. 2A.

Next, an isolation layer 205 may be etched to a certain depth so that a top surface of the isolation layer 205 becomes lower than a top surface of the active region 200A, as represented by an arrow of FIG. 9B, at least in a region where a gate is to be formed, hereinafter, a gate formation region G. Therefore, at least in the gate formation region G, the active region 200A may have a towering or protruding part which protrudes above or towers over the isolation layer 205.

Figure 10:
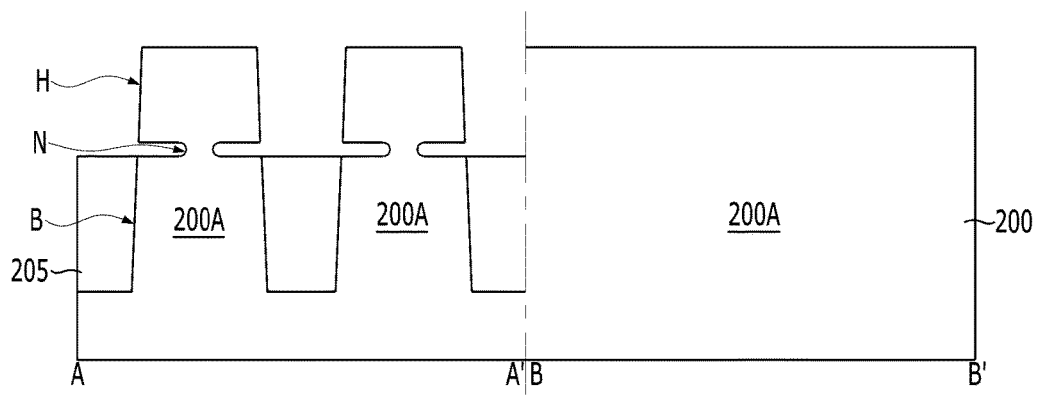

Referring to FIG. 10, a neck portion N may be formed by etching a part of the towering or protruding part of the active region 200A, thereby defining a head portion H and a body portion B of the active region 200A which are positioned over and under the neck portion N. The forming of the neck portion N may be performed using processes which are substantially same as the above-described processes of FIGS. 3 to 5.

Figure 11:
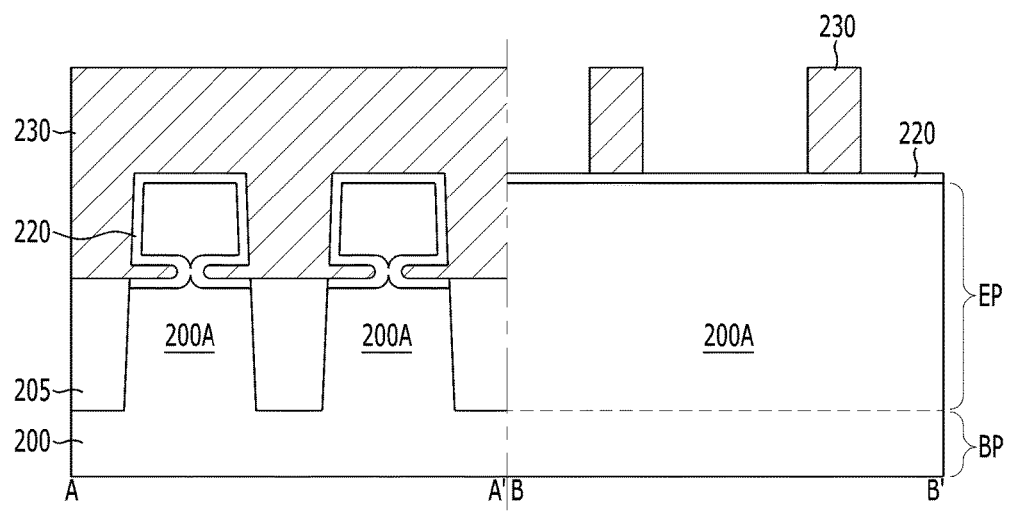

Referring to FIG. 11, an insulating layer 220 may be formed in a surface of the active region 200A. The forming of the insulating layer 220 may be performed using processes which are substantially same as the above-described processes of FIG. 6.

Then, a gate 230 may be formed to fill the gate formation region G. The forming of the gate 230 may be performed by depositing a conductive material covering a resultant structure and selectively etching the conductive material.

As a result, the gate 230 may surround the head portion H and the neck portion N in the first direction. Further, the gate 230 may be disposed over the element part EP in the region where the gate 230 is formed over the active region 200A.

The above and other memory circuits or semiconductor devices based on the disclosed technology can be used in a range of devices or systems. FIGS. 12-16 provide some examples of devices or systems that can implement the memory circuits disclosed herein.

Figure 12:
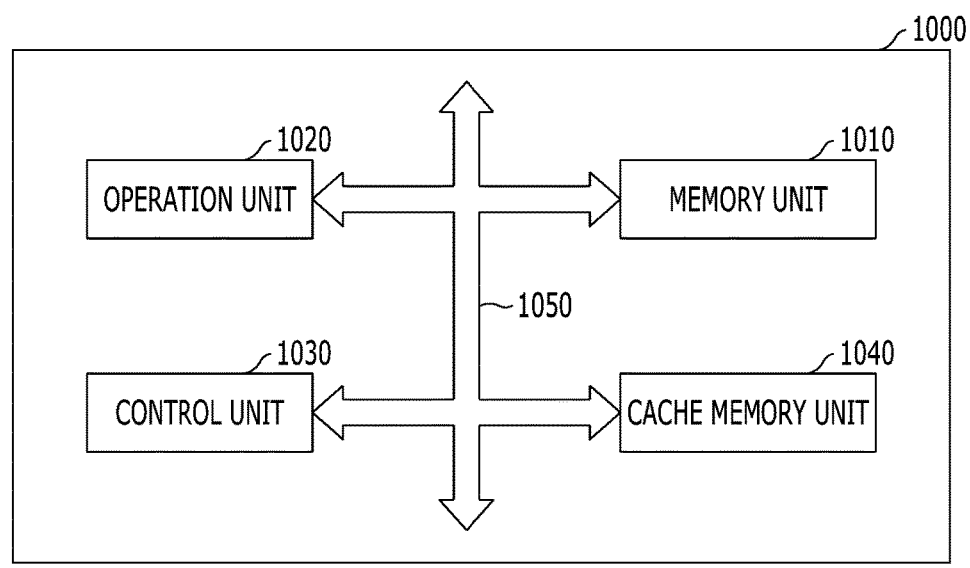
FIG. 12 is an example of configuration diagram of a microprocessor implementing memory circuitry based on the disclosed technology.

FIG. 12 is an example of configuration diagram of a microprocessor implementing memory circuitry based on the disclosed technology.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a transistor comprising a semiconductor substrate including an active region defined by an isolation layer; and a gate which is formed over the active region and the isolation layer and extends in a first direction to cross the active region, wherein the active region includes a head portion protruding above or towering over the isolation layer, a body portion disposed under the head portion, and a neck portion which is disposed between the head portion and the body portion and is recessed compared to the head portion and the body portion in the first direction, in a region where the gate and the active region overlap with each other. Through this, operating characteristics of the memory unit 1010, the operation unit 1020 or the control unit 1030 may be improved. As a consequence, operating characteristics of the microprocessor 1000 may be improved.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 13:
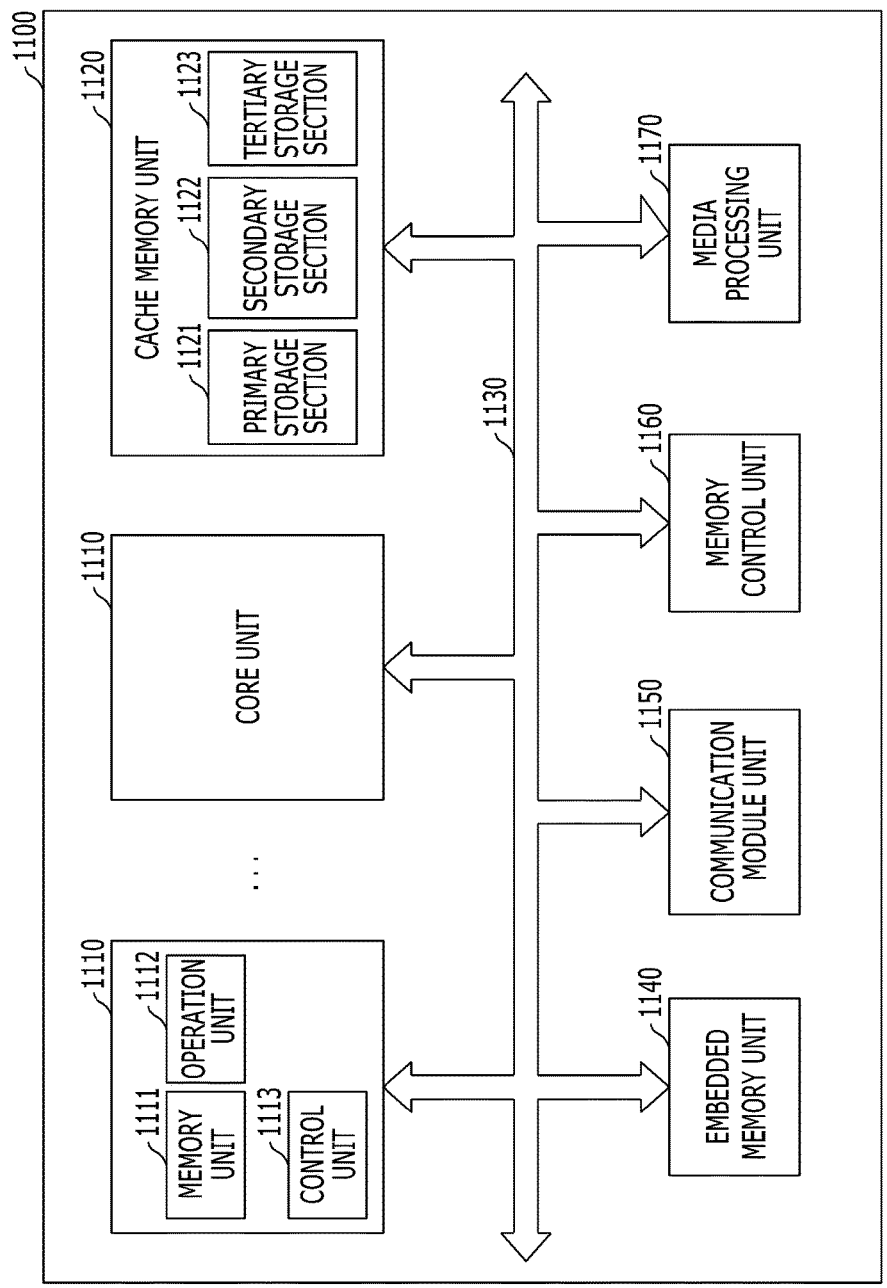
FIG. 13 is an example of configuration diagram of a processor implementing memory circuitry based on the disclosed technology.

FIG. 13 is an example of configuration diagram of a processor implementing memory circuitry based on the disclosed technology.

Referring to FIG. 13, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 13 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a transistor comprising a semiconductor substrate including an active region defined by an isolation layer; and a gate which is formed over the active region and the isolation layer and extends in a first direction to cross the active region, wherein the active region includes a head portion protruding above or towering over the isolation layer, a body portion disposed under the head portion, and a neck portion which is disposed between the head portion and the body portion and is recessed compared to the head portion and the body portion in the first direction, in a region where the gate and the active region overlap with each other. Through this, operating characteristics of the cache memory unit 1120, the core unit 1110 or the bus interface 1130 may be improved. As a consequence, operating characteristics of the processor 1100 may be improved.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
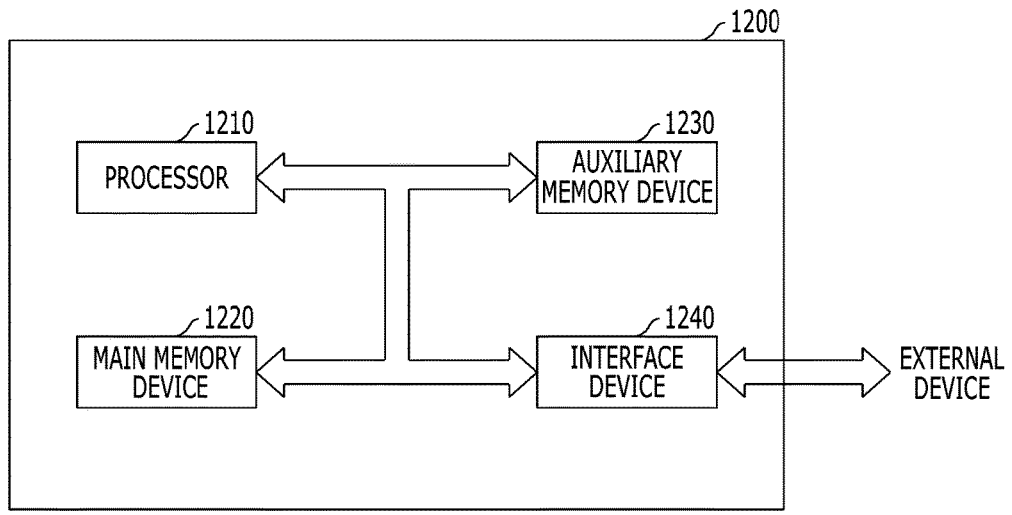
FIG. 14 is an example of configuration diagram of a system implementing memory circuitry based on the disclosed technology.

FIG. 14 is an example of configuration diagram of a system implementing memory circuitry based on the disclosed technology.

Referring to FIG. 14, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a transistor comprising a semiconductor substrate including an active region defined by an isolation layer; and a gate which is formed over the active region and the isolation layer and extends in a first direction to cross the active region, wherein the active region includes a head portion protruding above or towering over the isolation layer, a body portion disposed under the head portion, and a neck portion which is disposed between the head portion and the body portion and is recessed compared to the head portion and the body portion in the first direction, in a region where the gate and the active region overlap with each other. Through this, operating characteristics of the processor 1210, the main memory device 1220, the auxiliary memory device 1230 or the interface device 1240 may be improved. As a consequence, operating characteristics of the system 1200 may be improved.

Figure 15:
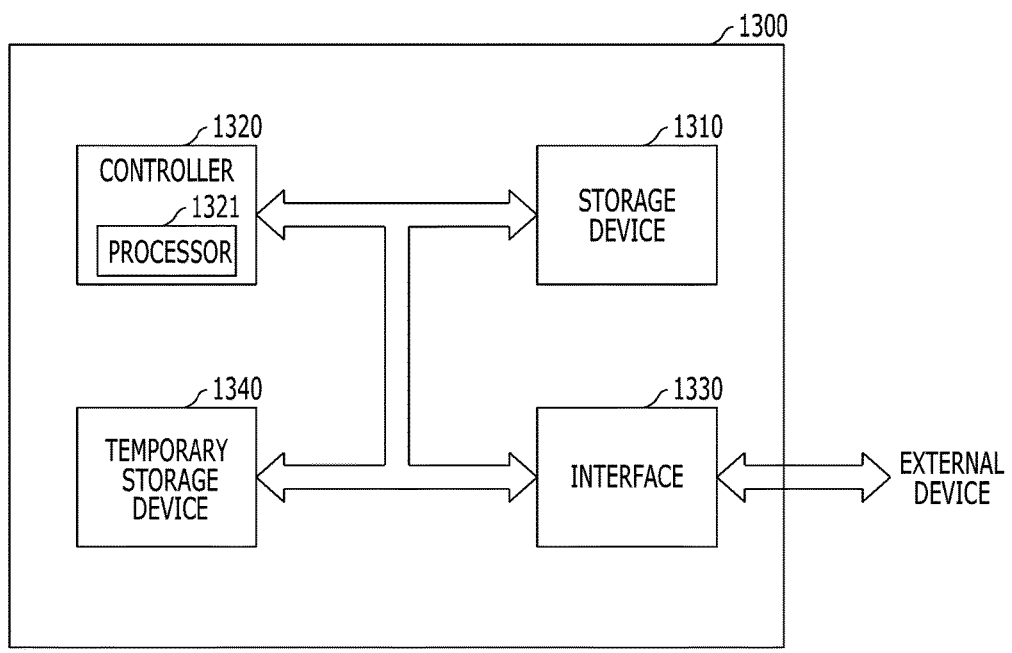
FIG. 15 is an example of configuration diagram of a data storage system implementing memory circuitry based on the disclosed technology.

FIG. 15 is an example of configuration diagram of a data storage system implementing memory circuitry based on the disclosed technology.

Referring to FIG. 15, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a transistor comprising a semiconductor substrate including an active region defined by an isolation layer; and a gate which is formed over the active region and the isolation layer and extends in a first direction to cross the active region, wherein the active region includes a head portion protruding above or towering over the isolation layer, a body portion disposed under the head portion, and a neck portion which is disposed between the head portion and the body portion and is recessed compared to the head portion and the body portion in the first direction, in a region where the gate and the active region overlap with each other. Through this, operating characteristics of the storage device 1310, the controller 1320, the interface 1330 or the temporary storage device 1340 may be improved. As a consequence, operating characteristics of the data storage system 1300 may be improved.

Figure 16:
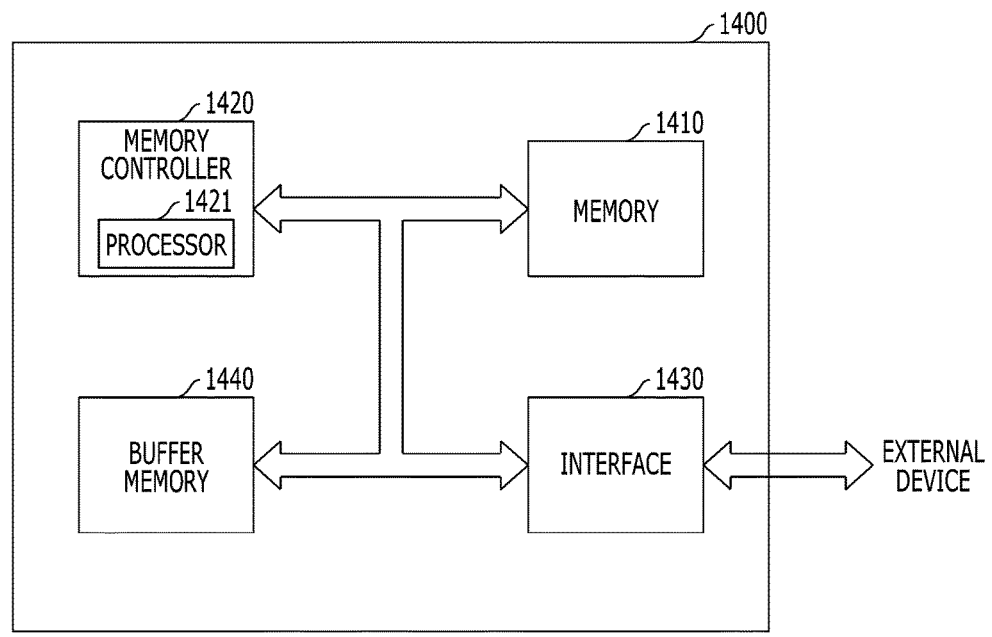
FIG. 16 is an example of configuration diagram of a memory system implementing memory circuitry based on the disclosed technology.

FIG. 16 is an example of configuration diagram of a memory system implementing memory circuitry based on the disclosed technology.

Referring to FIG. 16, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a transistor comprising a semiconductor substrate including an active region defined by an isolation layer; and a gate which is formed over the active region and the isolation layer and extends in a first direction to cross the active region, wherein the active region includes a head portion protruding above or towering over the isolation layer, a body portion disposed under the head portion, and a neck portion which is disposed between the head portion and the body portion and is recessed compared to the head portion and the body portion in the first direction, in a region where the gate and the active region overlap with each other. Through this, operating characteristics of the memory 1410, the memory controller 1420, the interface 1430 or the buffer memory 1440 may be improved. As a consequence, operating characteristics of the memory system 1400 may be improved.

Features in the above examples of electronic devices or systems in FIGS. 12-16 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a transistor, wherein the transistor includes:
    a semiconductor substrate including an active region defined by an isolation layer; and
    a gate which is formed over the active region and the isolation layer and extends in a first direction to cross the active region,
    wherein the active region includes a head portion protruding above the isolation layer, a body portion disposed under the head portion, and a neck portion which is disposed between the head portion and the body portion and is recessed compared to the head portion and the body portion in the first direction, in a region where the gate and the active region overlap with each other,
    wherein the semiconductor substrate includes a bulk part including only a semiconductor material and an element part which is disposed over the bulk part and includes other elements than the semiconductor material, and
    the gate is formed inside the element part in the region where the gate and the active region overlap with each other.

2. The electronic device of claim 1, wherein the gate surrounds the head portion and the neck portion in the first direction.

3. The electronic device of claim 1, comprising an insulating layer formed over surfaces of the head portion and the neck portion.

4. The electronic device of claim 1, further including:
    a memory element coupled to the active region disposed at a side of the gate.

5. The electronic device of claim 4, wherein the memory element includes a variable resistance element which is switched between different resistance states according to an applied voltage or current.

6. The electronic device of claim 5, wherein the variable resistance element includes a first magnetic layer, a second magnetic layer and a tunnel barrier layer interposed between the first magnetic layer and the second magnetic layer.

7. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit, wherein the transistor is part of at least one of the core unit, the cache memory unit and the bus interface in the processor.

8. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the transistor is part of at least one of the controller, the storage device, the temporary storage device and the interface in the data storage system.

9. An electronic device comprising a transistor, wherein the transistor includes:
a semiconductor substrate including an active region defined by an isolation layer; and
a gate which is formed over the active region and the isolation layer and extends in a first direction to cross the active region,
wherein the active region includes a head portion protruding above the isolation layer, a body portion disposed under the head portion, and a neck portion which is disposed between the head portion and the body portion and is recessed compared to the head portion and the body portion in the first direction, in a region where the gate and the active region overlap with each other, wherein:
the neck portion is electrically insulating so that the head portion and the body portion are electrically separated from each other.

10. The electronic device of claim 9, wherein the semiconductor substrate is a bulk substrate.

11. The electronic device of claim 9, wherein the transistor further includes:
junction regions formed in the active region disposed at both sides of the gate, and
wherein the head portion is surrounded by the insulating layer and the junction regions.

12. An electronic device comprising a transistor, wherein the transistor includes:
a semiconductor substrate including an active region defined by an isolation layer; and
a gate which is formed over the active region and the isolation layer and extends in a first direction to cross the active region,
wherein the active region includes a head portion protruding above the isolation layer, a body portion disposed under the head portion, and a neck portion which is disposed between the head portion and the body portion and is recessed compared to the head portion and the body portion in the first direction, in a region where the gate and the active region overlap with each other, wherein the semiconductor substrate includes a bulk part including only a semiconductor material and an element part which is disposed over the bulk part and includes other elements than the semiconductor material, and
the gate is formed over the element part in the region where the gate and the active region overlap with each other.

13. An electronic device comprising transistors formed in a semiconductor structure which includes:
a substrate;
active regions formed in the substrate, each active region including drain and source regions for the transistors;
isolation trenches formed in the substrate and located between the active regions to separate the active regions, the isolation trenches being separated from one another along a first direction and each extending along a second direction;
isolation layers respectively formed in the isolation trenches to separate the active regions;
wherein each active region includes a protruding portion that protrudes over the isolation layer, a body portion that is located at a level at and below the isolation layer and a neck portion between the protruding portion and the body portion that is recessed relative to the protruding and body portions to have a smaller width; and
gates formed of an electrically conductive material, located over the active regions and separated from one another in the second direction, each gate being structured to extend in the first direction, to surround a protruding portion of an active region, and to locate between a source region and a drain region to form a transistor,
each neck portion is electrically insulating to electrically separate the protruding portion and the body portion.

14. The electronic device of claim 13, comprising:
an insulating layer formed over surfaces of the protruding portion and neck portion of each active region.

15. The electronic device of claim 13, wherein the neck portion is structured to provide a large recess to increase a contact area between a gate and a corresponding active region.

16. The electronic device of claim 13, further including:
an array of memory elements on the substrate each operable to store data,
wherein each memory element is electrically coupled to a respective transistor to be connected to a corresponding bit line through a corresponding contact.

17. The electronic device of claim 16, wherein:
each memory element includes a variable resistance element on the substrate which exhibits different resistance values to store data.

18. The electronic device of claim 17, wherein:
each variable resistance element includes a magnetic tunnel junction.

* * * * *